United States Patent
Vignal et al.

(10) Patent No.: US 10,879,841 B2
(45) Date of Patent: Dec. 29, 2020

(54) PANEL EQUIPPED WITH A PHOTOVOLTAIC DEVICE

(71) Applicant: ArcelorMittal, Luxembourg (LU)

(72) Inventors: Renaud Vignal, Sevrier (FR); Laurent Geron, Cerexhe-Heuseux (BE)

(73) Assignee: ArcelorMittal, Luxembourg (LU)

( * ) Notice: Subject to any disclaimer, the term of this patent is extended or adjusted under 35 U.S.C. 154(b) by 124 days.

(21) Appl. No.: 15/322,678

(22) PCT Filed: Jul. 1, 2015

(86) PCT No.: PCT/IB2015/001092
§ 371 (c)(1),
(2) Date: Dec. 28, 2016

(87) PCT Pub. No.: WO2016/001738
PCT Pub. Date: Jan. 7, 2016

(65) Prior Publication Data
US 2017/0155359 A1    Jun. 1, 2017

(30) Foreign Application Priority Data

Jul. 1, 2014   (WO) .................. PCT/IB2014/001240

(51) Int. Cl.
*H02S 40/36* (2014.01)
*H01L 31/042* (2014.01)
(Continued)

(52) U.S. Cl.
CPC ........ *H02S 40/36* (2014.12); *H01L 31/03926* (2013.01); *H01L 31/042* (2013.01);
(Continued)

(58) Field of Classification Search
None
See application file for complete search history.

(56) References Cited

U.S. PATENT DOCUMENTS

| 4,392,483 A * | 7/1983 | Koenig | .................. | F24S 25/40 |
| | | | | 126/650 |
| 5,022,930 A | 6/1991 | Ackerman et al. | | |

(Continued)

FOREIGN PATENT DOCUMENTS

| CN | 102881752 A | 1/2013 |
| CN | 103151409 A | 6/2013 |

(Continued)

*Primary Examiner* — Shannon M Gardner
(74) *Attorney, Agent, or Firm* — Davidson, Davidson & Kappel, LLC

(57) ABSTRACT

The present invention provides a panel equipped with a photovoltaic device including an even number of columns of photovoltaic modules, the columns being aligned essentially parallel to a longitudinal edge of the panel. Each column includes an electrical pole on each of extremity. The polarity of an electrical pole of one extremity being the inverse of that of the electrical pole of the other extremity, the poles of two adjacent columns being of inverse polarity, the electrical pole being in the form of a male connector when it is of one polarity and in the form of a female connector when it is of the inverse polarity. The male connectors and female connectors arranged so that they interlock with one another when the lower transverse edge of an upper panel overlaps the upper transverse edge of a lower panel. The present invention further provides an assembly of panels, an electrical device connected to a converter including an assembly and a method for the electrical connection to a converter of the panels of the assembly.

10 Claims, 3 Drawing Sheets

(51) Int. Cl.
  *H02S 20/25*       (2014.01)
  *H01L 31/046*      (2014.01)
  *H02S 20/23*       (2014.01)
  *H02S 40/32*       (2014.01)
  *H01L 31/0392*     (2006.01)
  *H01L 31/18*       (2006.01)

(52) U.S. Cl.
  CPC ........ *H01L 31/046* (2014.12); *H01L 31/1876* (2013.01); *H02S 20/23* (2014.12); *H02S 20/25* (2014.12); *H02S 40/32* (2014.12); *Y02B 10/10* (2013.01); *Y02E 10/50* (2013.01)

(56) References Cited

U.S. PATENT DOCUMENTS

| | | | |
|---|---|---|---|
| 6,606,830 | B2 | 8/2003 | Nagao et al. |
| 7,897,020 | B2 | 3/2011 | Mackie et al. |
| 8,021,905 | B1 | 9/2011 | Nath et al. |
| 8,507,784 | B2 | 8/2013 | White |
| 8,776,455 | B2 | 7/2014 | Azoulay |
| 8,782,972 | B2 | 7/2014 | Grieco |
| 9,029,693 | B2 | 5/2015 | Li |
| 9,813,016 | B2 | 11/2017 | Chabas et al. |
| 9,887,627 | B2 | 2/2018 | Erickson, Jr. et al. |
| 2008/0135094 | A1 | 6/2008 | Corrales |
| 2008/0245404 | A1 | 10/2008 | DeLiddo |
| 2009/0293864 | A1 | 12/2009 | Augenbraun et al. |
| 2011/0100436 | A1 | 5/2011 | Cleereman et al. |
| 2012/0151856 | A1 | 6/2012 | Azoulay |
| 2013/0014455 | A1 | 1/2013 | Grieco |
| 2013/0062958 | A1 | 3/2013 | Erickson, Jr. et al. |
| 2014/0053890 | A1 | 2/2014 | Yang |
| 2014/0109951 | A1 | 4/2014 | Despesse |
| 2017/0155357 | A1 | 6/2017 | Vignol et al. |
| 2018/0152135 | A1 | 5/2018 | Vignal et al. |
| 2018/0152136 | A1 | 5/2018 | Vignal et al. |
| 2018/0159462 | A1 | 6/2018 | Vignal et al. |

FOREIGN PATENT DOCUMENTS

| | | |
|---|---|---|
| DE | 10109643 A1 | 9/2002 |
| FR | 2923082 A1 | 5/2009 |
| FR | 2947099 A1 | 12/2010 |
| FR | 2950911 A1 | 4/2011 |
| JP | S6052639 U | 4/1985 |
| JP | H0685306 A | 3/1994 |
| JP | H10102708 A | 4/1998 |
| JP | H11141064 A | 5/1999 |
| JP | 2001-267617 A | 9/2001 |
| JP | 2001267617 A | 9/2001 |
| JP | 2003078155 A | 3/2003 |
| JP | 2003314011 A | 11/2003 |
| JP | 2006032501 A | 2/2006 |
| JP | 2007019140 A | 1/2007 |
| JP | 2009127327 A | 6/2009 |
| JP | 2011529322 A | 12/2011 |
| JP | 2013080885 A | 5/2013 |
| JP | 2013143502 A | 7/2013 |
| JP | 2013181325 A | 9/2013 |
| KR | 20120028991 A | 3/2012 |
| WO | 2011144546 A1 | 11/2011 |
| WO | 2013010054 A1 | 1/2013 |
| WO | 2016189341 A1 | 12/2016 |
| WO | 2016189342 A1 | 12/2016 |
| WO | 2016189343 A1 | 12/2016 |

\* cited by examiner

PANEL EQUIPPED WITH A PHOTOVOLTAIC DEVICE

The present invention relates to an exterior cladding panel for a building equipped with a photovoltaic device. A panel of this type is intended principally for the construction of photovoltaic roofs, although it is not limited to this application.

BACKGROUND

It is known to equip the roofs of buildings with a set of photovoltaic modules that are electrically connected to one another so as to enable the generation of electric energy.

The photovoltaic modules are formed by a set of photovoltaic cells connected in series. More specifically, the cells are arranged in columns, wherein the columns are connected to one another to form a sort of folded ribbon. Each module, on its periphery, has two electrical poles located close to each other in the form of a + terminal and a − terminal.

During the assembly of the roofing modules, it is desirable on one hand to minimize the length of cable and on the other hand, to prevent the cable from forming induction loops that interfere with the generation of energy.

To do this, it is known in particular from CN103151409 to wire the modules "horizontally" as illustrated in FIG. 1. In a first row, the modules, the electrical poles of which are located in the upper part, are connected in series. This row is connected to the top row made of modules which are connected to one another in series and the electrical poles of which are located in the lower portion. This type of wiring makes it possible to have a smaller induction loop, although it has several disadvantages:
- the connection of two successive modules is on the rear side, which may necessitate access to the roof boarding,
- if an uneven number of rows of modules is to be installed as a roof, the wiring becomes more complicated and requires a great deal of cable,
- the cables exit on the side of the roof, which also necessitates access to the roof boarding to connect the cables to the electrical grid.

It is also known from WO2011/144546 that the modules may be wired via the intermediary of a connection system that makes it possible to connect the photovoltaic system to electronic power converters at the level of the ridge of the roof. However, this connection system makes the electrical connection of two adjacent roofing elements complex. During the installation of the photovoltaic roof, it is necessary to manually perform numerous steps after the assembly of two longitudinally adjacent panels before the two panels are electrically connected. It is necessary to position a box overlapping between the two adjacent panels, mount the electrical conductors on supports, inject a silicone gel etc.

BRIEF SUMMARY

An object of the present invention is to remedy the problems described above by making available an exterior cladding panel for a building equipped with a photovoltaic device that facilitates the installation of a photovoltaic roof by minimizing the operations that must be performed on site and by simplifying the remaining operations.

The present invention provides a panel equipped with a photovoltaic device constituted by an even number of columns of photovoltaic modules, the columns being aligned essentially parallel to one longitudinal edge of the panel, each column comprising an electrical pole on each of its extremities, the polarity of an electrical pole of one extremity being the inverse of that of the electrical pole of the other extremity, the poles of two adjacent columns being of inverse polarity, the electrical pole being in the form of a male connector when it is of one polarity and in the form of a female connector when it is of the opposite polarity and the male and female connectors being arranged so that they interlock with one another when the lower transverse edge of an upper panel overlaps the upper transverse edge of a lower panel.

The panel according to the invention may also comprise the following optional characteristics, considered individually or in combination:
- the panel is made of a formed metal sheet,
- the photovoltaic modules are flexible ribbons glued to the panel,
- the photovoltaic modules have been deposited directly on the panel by successive deposits of layers of appropriate types by vacuum deposition methods,
- the columns are not electrically connected to one another,
- the columns are of identical length and their extremities are aligned essentially parallel to a transverse edge of the panel.

The present invention also provides an assembly of panels according to the invention, juxtaposed by marginal overlapping of their longitudinal edges and/or of their transverse edges to form rows of photovoltaic modules in the longitudinal direction.

The present invention further provides an electrical device that may be connected to a converter comprising an assembly according to the invention inclined along a given slope, for which:
- at the bottom of the slope of the assembly, the electrical pole of the lower extremity of the first row is electrically connected to the electrical pole of the lower extremity of the second row, and so on,
- at the level of the marginal overlap of two adjacent panels of a given row, the electrical pole of the lower extremity of each column of the upper panel is connected to the facing electrical pole of inverse polarity on the lower panel,
- at the ridge of the roof, the electrical poles of the upper extremities of the rows are connected to the converter or among themselves in a manner similar to what is done at the bottom of the slope.

The present invention even further provides a method of electrical connection, to a converter, of the constituent panels of an assembly according to the invention inclined along a slope, comprising the steps in which:
- at the bottom of the slope of the assembly, the electrical pole of the lower extremity of the first row is electrically connected to the electrical pole of the lower extremity of the second row, and so on,
- at the level of the marginal overlap of two adjacent panels of a given row, the electrical pole of the lower extremity of each column of the upper panel is connected to the facing electrical pole of inverse polarity on the lower panel,
- at the ridge of the roof, the electrical poles of the upper extremities of the rows are connected to the converter or among themselves in a manner similar to what is done at the bottom of the slope.

Other characteristics and advantages of the invention are described in greater detail below.

BRIEF DESCRIPTION OF THE DRAWING

The invention will be better understood from a reading of the following description, which is intended to be explanatory but not restrictive, with reference to the accompanying figures, in which.

DETAILED DESCRIPTION

The same reference numbers represent the same elements in each of the figures.

Throughout the text, a panel means an element that has a flat shape, i.e. its thickness is low compared to its other dimensions. The panel may be in the form of a plate or sheet constituted by a single material or a composite assembly. In the latter case, the panel is a stack of a plurality of layers of the same material or different materials. The material in question may be, among other things, a metal material, a polymer or even a ceramic. The metal materials steel, aluminum, copper and zinc may be cited as non-restricting examples. The panel is preferably a metal sheet. It is preferably made of previously galvanized and pre-coated steel to protect it against corrosion. The panel may optionally be foamed on its bottom surface and thereby constitute the exterior facing of a sandwich panel.

In the framework of the invention, the panel will preferably have been previously formed by means of any known forming method, including, by way of non-restricting examples, bending, roll forming, stamping and molding.

This forming leads among other things to the formation of ribs on the surface of the panel. Throughout the text, a rib means a protrusion formed on the surface of the panel. The rib may have a trapezoidal shape, as in the case of the exemplary embodiments described below, or a rectangular, corrugated, sinusoidal or even omega shape, for example. It comprises a top central part and two lateral wings.

To form a roof or a facade, the panels are assembled by the marginal overlapping of their longitudinal edges and their transverse edges and are affixed to the supporting structure of the building by fastening means such as screws, nails or even rivets.

Throughout the text, a photovoltaic module means an assembly that is capable of converting solar energy into electricity, and is delimited by a protective barrier that isolates electrically interconnected photovoltaic cells from the exterior.

Figure 1:
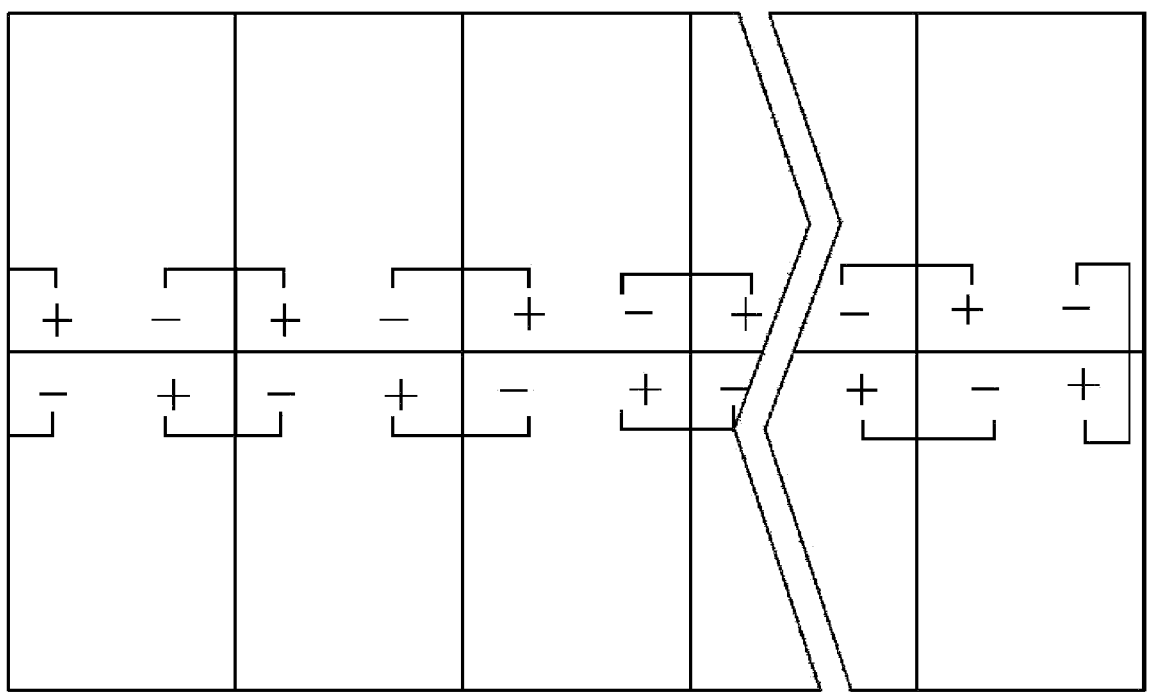
FIG. 1 is a schematic representation of an assembly of panels according to the prior art.
Figure 2:
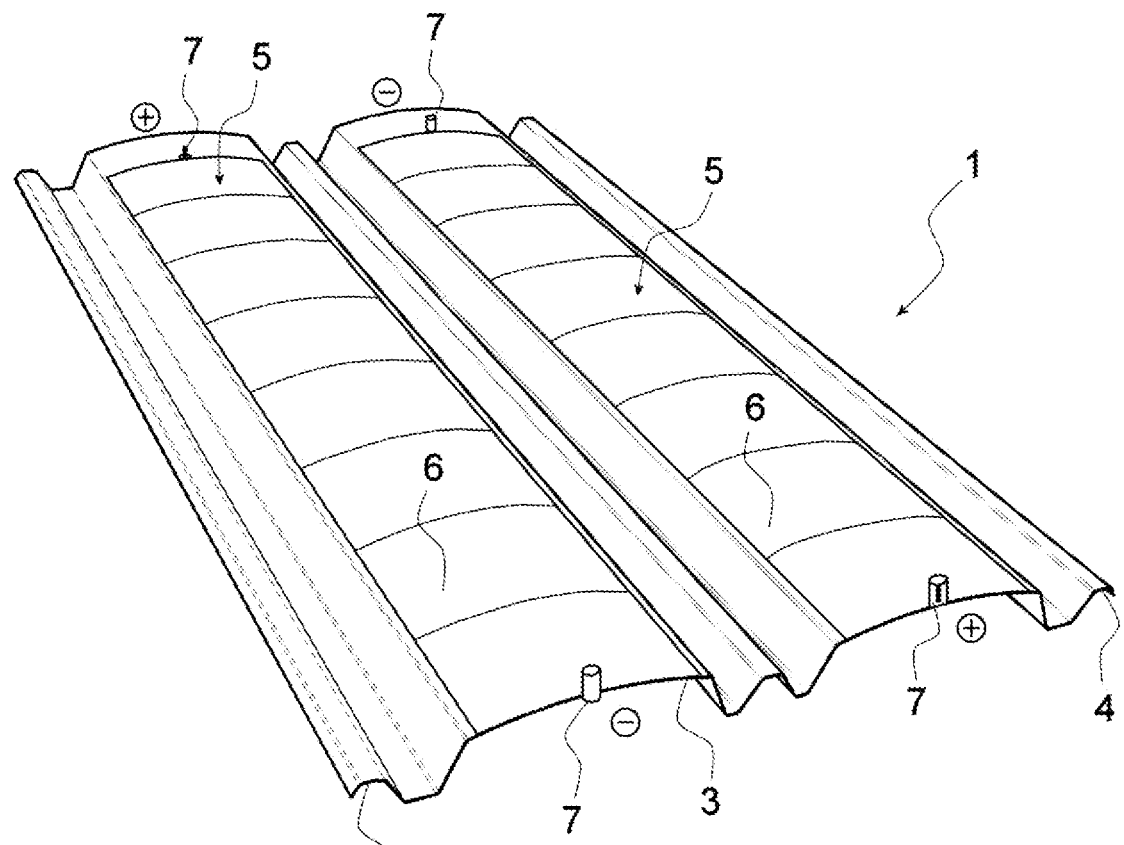
FIG. 2 is a schematic representation in perspective of a panel according to one variant of the invention.

With reference to FIG. 2, the panel 1 is constituted principally by a first longitudinal edge 2, a central part 3 which is at least partly covered by a photovoltaic device and a second longitudinal edge 4.

The photovoltaic device is constituted by an even number of columns 5 of photovoltaic modules located on the upper surface of the panel. Each of the columns comprises at least one photovoltaic module formed by an assembly of photovoltaic cells 6. By way of non-restricting example, it may be a module in the form of a flexible ribbon glued to the central part of the panel or a module deposited directly on the central part of the panel by successive deposits of layers of an appropriate type using vacuum deposition methods.

Within each photovoltaic module, the arrangement and the organization of these photovoltaic cells is not limiting. By way of a non-restricting example, the cells may be located one below another in a single row or may be arranged in a plurality of rows, the rows being connected to one another to form a sort of folded ribbon. Preferably, and to facilitate the deposition of the photovoltaic modules directly on the panel using vacuum deposition methods, the cells are arranged in a single row.

A column 5 of photovoltaic modules may therefore be monolithic, in other words made in a single piece, or may be constituted by a plurality of photovoltaic modules placed end to end in an alignment. Two successive photovoltaic modules are placed end to end by establishing electrical contact between the last photovoltaic cell of one module and the first photovoltaic cell of the other module so that the two cells are connected in series.

The columns are aligned essentially parallel to a longitudinal edge of the panel. Preferably, the columns are of identical length and their extremities are aligned essentially parallel to a transverse edge of the panel to facilitate the connection of the columns of two adjacent panels.

To facilitate the wiring of an assembly of panels, as will be described below, the photovoltaic device also has the following characteristics:

an even number of columns, each column comprises an electrical pole 7 on each of its extremities, the polarity of an electrical pole of one extremity being the inverse of that of the electrical pole of the other extremity, the poles of two adjacent columns are of inverse polarity.

The presence of the electrical poles on the upper surface of the panel facilitates the connection of the modules to one another when the panel is installed on the building. It is no longer necessary to have access to the roof boarding to install the wiring.

Preferably, the columns of a panel are not electrically connected to one another. The electrical connection between the columns will be made only after the assembly of the panels, as will be described below. This simplifies the fabrication of the panel in the factory and makes it possible to adapt the wiring to the specificities of the assembly on the construction site.

Each column comprises, on one of its extremities, a male connector that functions as the first electrical pole, and on its other extremity a female connector that functions as the second electrical pole, the two connectors being arranged so that they interlock with one another when the lower transverse edge of an upper panel overlaps the upper transverse edge of a lower panel. Interlocking means that a portion of the male connector is inserted into a part of the female connector when two adjacent panels are brought together, so that the two panels are electrically connected simultaneously with their assembly into a roof, without the need to perform additional steps such as, for example, the manual connection of two electrical cables. For this purpose, one part of the male connector has a form that is complementary to one part of the female connector. Preferably, the axis of the male and female connectors is adjusted to make it possible to bring the two panels together easily. Preferably, the axis is oriented perpendicular to the panel. A connection of this type facilitates the assembly of the panels on a building and simplifies the wiring of the photovoltaic installation.

The female connector may consist, for example, of a box located at the level of the lower transverse edge of the panel and comprising a female socket, the axis of which is oriented perpendicular to the panel. In this case, the corresponding male connector consists of a male plug the axis of which is oriented perpendicular to the panel, located at the level of the upper transverse edge. During the installation of the upper panel by moving along an axis oriented perpendicular to the lower panel, the male connector and the female connector are interlocked.

The panels according to the invention are preferably fabricated in the factory, then transported to the site before being assembled, as described below and illustrated in FIG. 3. On one hand, the fabrication of the entire panel in the factory makes it possible to guarantee its quality and correct operation, and on the other hand, the assembly operations on the site are minimized thanks to the installation of the exterior cladding of the building and of the photovoltaic assembly in a single step.

Preferably, the panels intended for a given assembly each have a first column 5 in which each of poles 7 has the same polarity as the corresponding pole of the first column of another panel. The dimensions of the panels and the number of columns of photovoltaic modules of the panels may vary, however.

On structure 8 of the building to be covered, a first panel 1 is put in place by fastening means such as screws, nails or even rivets. Preferably, the panel is oriented so that its longitudinal edges run in the direction of the slope. This orientation facilitates the drainage of rainwater on the assembly and preserves its water-tightness.

Then one or more panels are arranged around the first panel and assembled to one another:
  by marginal overlapping of the transverse edges of adjacent panels to form rows of photovoltaic modules so that each electrical pole of a lower extremity of a column of photovoltaic modules of the upper panel is facing an electrical pole of inverse polarity of an upper end of a column of the lower panel.
  and/or by marginal overlapping of the longitudinal edges of adjacent panels to multiply the number of rows.

A row of photovoltaic modules is therefore defined as a juxtaposition in the longitudinal direction of columns of photovoltaic modules. Depending on the shape of the structure to be covered and local restrictions such as, for example, the presence of a window, a door or a chimney, the rows of panels may be of variable lengths.

In this manner, an assembly of panels is obtained forming a plurality of rows 9 of photovoltaic modules. Because each panel is equipped with an even number of columns of photovoltaic modules, the number of rows is even. The number of photovoltaic modules per row depends on the number of panels next to one another in a given row and may therefore vary from one row to another. In the case of a panel that does not exhibit any marginal overlap of its transverse edges, the row of photovoltaic modules merges with the column of photovoltaic modules.

Each row comprises an electrical pole on each of its extremities, the polarity of an electrical pole of one extremity being the inverse of that of the electrical pole of the other extremity and the poles of two adjacent rows being of inverse polarity. In other words, each row comprises, at its lower extremity, an electrical pole which merges with the electrical pole of the lower extremity of the first column of this row, and on its upper extremity an electrical pole of inverse polarity that merges with the electrical pole of the upper extremity of the last column of this row. Two adjacent columns of a panel being of inverse polarity, this reversal of polarities is also found at the level of two adjacent rows.

Columns 5 of photovoltaic modules of each panel are then electrically connected as described below.

At the bottom of slope 10 of the assembly, electrical pole 7 of the lower extremity of first row 9 is electrically connected to the electrical pole of the lower extremity of the second row, the electrical pole of the lower extremity of the third row is connected electrically to the electrical pole of the lower extremity of the fourth row and so on.

In practice, this electrical connection is made by means of transverse connectors 11 such as, by way of non-restricting examples, a flexible electric cable or a rigid electric connecting strip. If the electrical poles of the extremities of the rows are equipped with male and female connectors, the wire or the connecting strip are extended by equivalent male and female connectors that make it possible to connect the connector of the extremity of the row to the wire or to the connecting strip.

Transverse connectors 11 may also comprise a diode oriented in such a manner that it blocks the passage of current from the positive electrical pole toward the negative electrical pole and make possible the passage of current in the inverse direction. This diode makes it possible, when necessary, to short-circuit a defective column.

At the level of marginal overlap 12 of two adjacent panels of a given row, the electrical pole of the lower extremity of each column of the upper panel is connected to the facing electrical pole of inverse polarity on the lower panel, in other words the electrical pole of the upper extremity of the corresponding column of the lower panel.

In practice, this electrical connection is made simply by interlocking the male and female connectors if the columns of photovoltaic modules are equipped with them on their extremities at the same time as the panels are installed. Alternatively, the connection may be made by means of vertical connectors 13 similar to the transverse connectors described above.

At the ridge 14, the electrical poles of the upper extremities of the rows are connected to the converter or to one another in a manner similar to the connection at the bottom of the slope as a function of the acceptable input voltage for the converter. This input voltage is adjusted by adapting the number of columns connected among themselves in series. A person skilled in the art will be able to adapt this connection principle to the specific case. FIG. 3 illustrates one type of possible connection at the ridge of the roof. The upper electrical pole of the first row is connected to the converter. The upper electrical pole of the second row is connected to the upper electrical pole of the third row by means of a transverse connector 15 similar to those used at the bottom of the slope. The upper electrical pole of the fourth row is connected to the upper electrical pole of the fifth row in the same manner. Finally, the upper electrical pole of the sixth row is connected to the converter circuit. The n photovoltaic modules of the first six rows are thus connected in series and deliver to the converter a voltage equal to n times their nominal voltage.

The following columns are then connected using the same method.

Therefore the output of the cables toward the converter is provided at the ridge of the roof, which is easy to access and facilitates their installation or access in case of repair.

Figure 3:
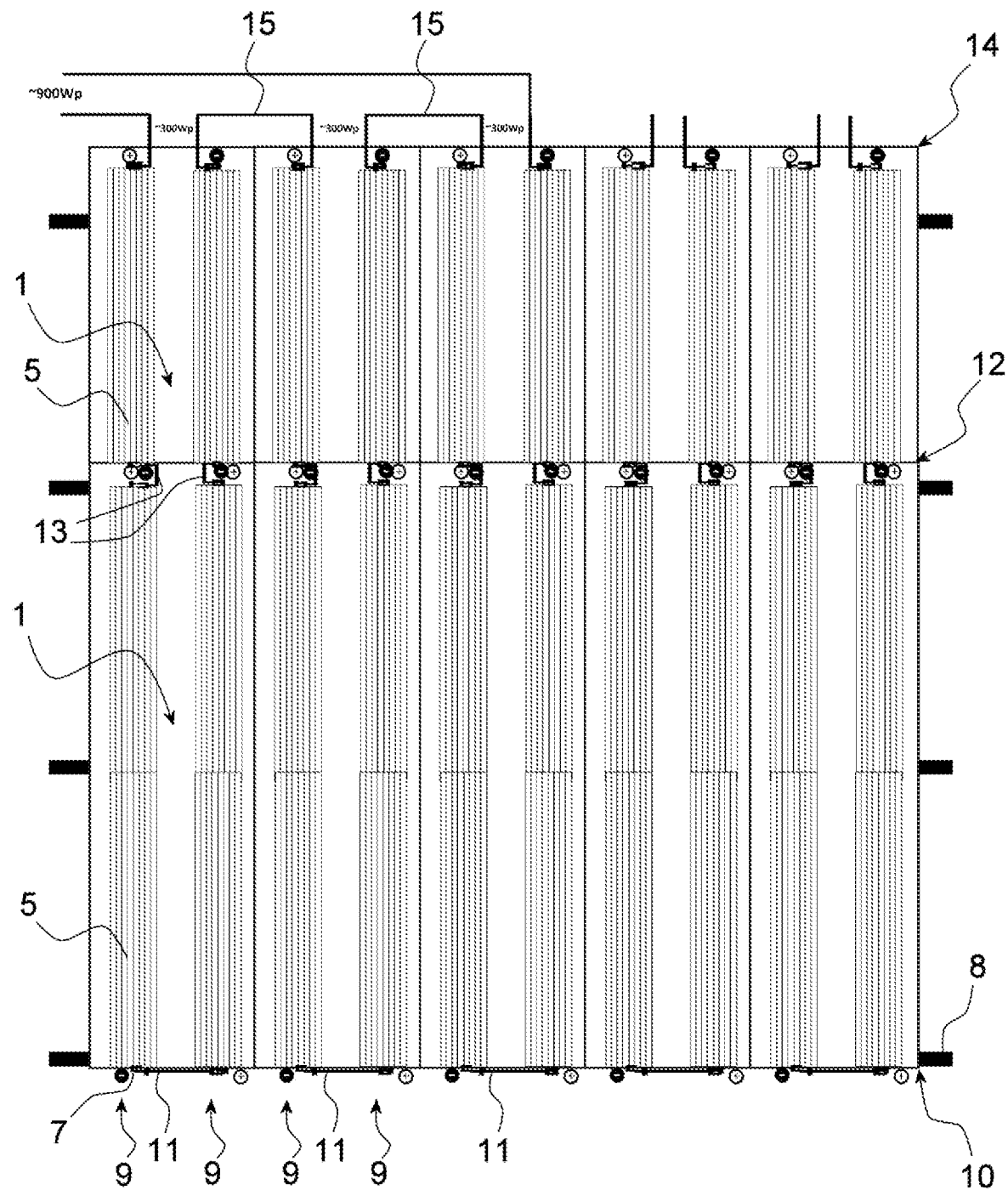
FIG. 3 is a schematic representation of an assembly of panels according to one variant of the invention.

As the connection principle illustrated in FIG. 3 shows, the even number of columns 5, and therefore of rows 9, guarantees that the electrical connection to the converter may be made at the ridge of the roof without recourse to any long electric cable that runs the length of the roof. An uneven number of columns would result in a last row, the lower electrical pole of which could not be connected to the converter at the ridge of the roof, except by recourse to a cable running the entire height of the roof.

Figure 4:
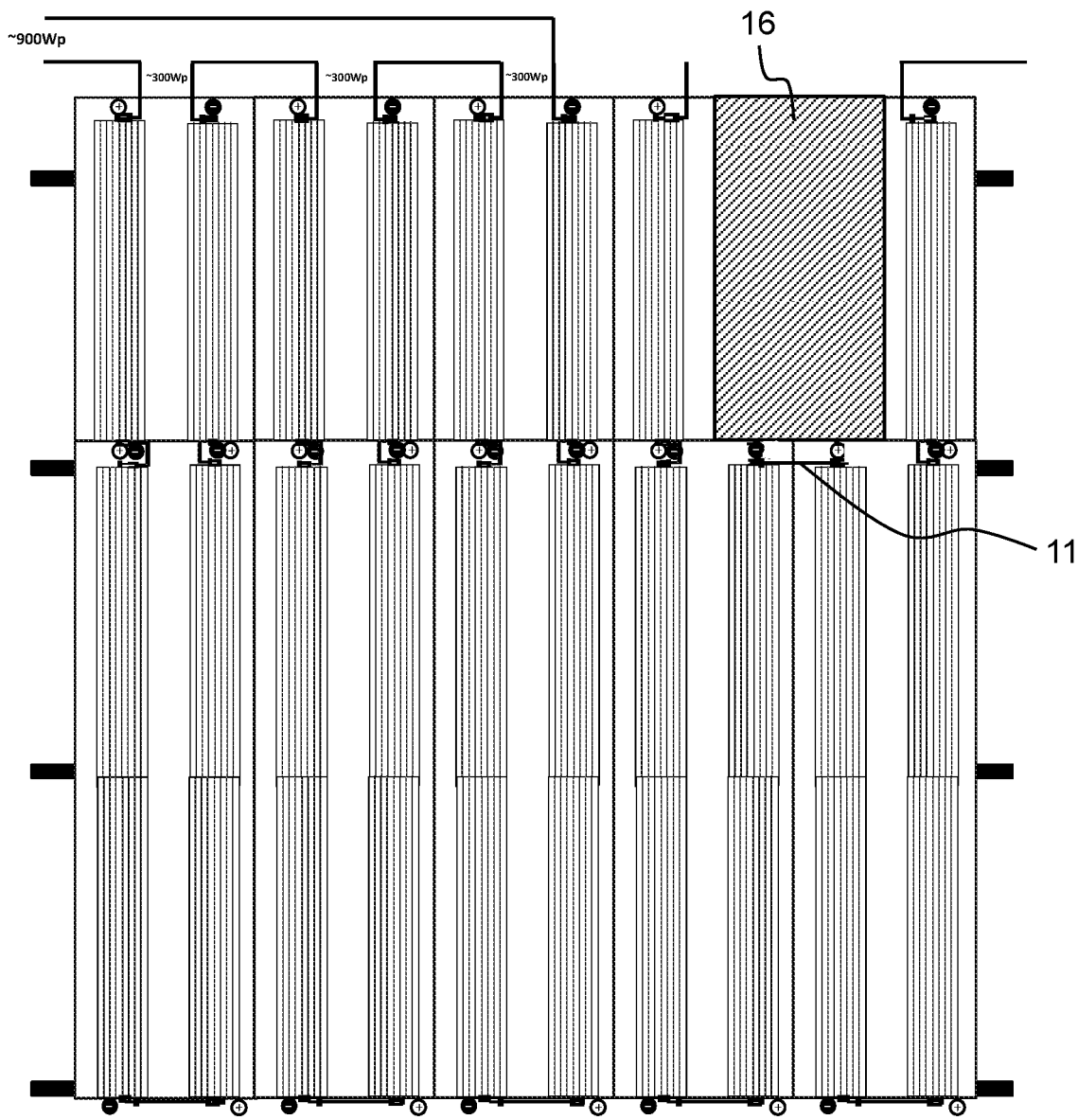
FIG. 4 is a schematic representation of an assembly of panels according to one variant of the invention.

The use of the panels according to the invention offers major flexibility in the design of the wiring plan. It is therefore possible to adapt the wiring plan of the photovoltaic installation in case of features in the roof such as, for example, a chimney stack, a ventilation opening, a garret window, a dormer or an access trapdoor. As illustrated in FIG. 4, a feature 16 in the roof has made it necessary to cut two panels longitudinally, whereby each of these two panels then has only one single column of photovoltaic modules. In terms of wiring, the feature in the roof may easily be bypassed by the simple installation of a transverse connector 11 under the feature in the roof.

In a second exemplary embodiment of the assembly of the panels, the manner of connecting the modules at the bottom of the slope and at the ridge of the roof may be reversed so that the wiring output is located at the bottom of the slope.

Therefore, thanks to the delivery on the construction site of panels according to the invention, it is very easy to put the panels in position and to connect the photovoltaic modules at the same time or afterwards.

What is claimed is:

1. A panel equipped with a photovoltaic device comprising:
   a longitudinal edge, a lower transverse edge and an upper transverse edge; and
   an even number of columns, each column including at least one photovoltaic module, the even number of columns including a first column and an adjacent second column;
   the first and second columns being aligned with the longitudinal edge;
   the first column having a first column first electrical pole at a first column extremity toward the lower transverse edge and a first column second electrical pole at an other first column extremity toward the upper transverse edge, the first column first electrical pole having a first inverse polarity from a first polarity of the first column second electrical pole, the first column first electrical pole being one of a male connector and a female connector and the other of the first column second electrical pole being the other of the male and the female connector;
   the second column having a second column first electrical pole at a second column extremity toward the lower transverse edge and a second column second electrical pole at an other second column extremity toward the upper transverse edge, the second column first electrical pole having a second inverse polarity from a second polarity of the second column second electrical pole, the second column first electrical pole being one of a second male connector and a second female connector and the second column second electrical pole being the other of the second male connector and second female connector;
   the first inverse polarity of the first column first electrical pole also being of inverse polarity from the second inverse polarity of the second column first electrical pole, and the first polarity of the first column second electrical pole being of inverse polarity from the second polarity of the second column second electrical pole;
   the first column first electrical pole and the second column first electrical pole thus defining a first connector pair capable of interlocking to respective female or male connectors at an overlapping upper transverse edge of a further lower panel, or the first column second electrical pole and the second column second electrical pole defining a second connector pair capable of interlocking to further respective female or male connectors at an overlapping lower transverse edge of a further upper panel.

2. The panel according to claim 1, wherein the first and second columns are essentially parallel with the longitudinal edge of the panel.

3. The panel according to claim 1, wherein the panel is made of a formed metal sheet.

4. The panel according to claim 1, wherein the photovoltaic module is a flexible ribbon glued to the panel.

5. The panel according to claim 1, wherein the photovoltaic module is deposited directly on the panel by successive deposits of layers by vacuum deposition methods.

6. The panel according to claim 1, wherein the first and second columns are not electrically connected to one another.

7. The panel according to claim 1, wherein the first and second columns are of identical length and the first column extremity and the second column extremity extremities are aligned essentially parallel to the lower a transverse edge of the panel.

8. The panel according to claim 1, wherein the male and female connectors and the second male and second female connectors extend perpendicularly with respect to the longitudinal edge.

9. The panel according to claim 1, wherein the first column first electrical pole defines the male connector of the first connector pair, and the second column first electrical pole defines the second female connector of the first connector pair.

10. The panel according to claim 1, wherein the first column first electrical pole defines the female connector of the first connector pair, and the second column first electrical pole defines the second male connector of the first connector pair.

* * * * *